(12) United States Patent
Bouyat

(10) Patent No.: US 8,669,813 B2
(45) Date of Patent: Mar. 11, 2014

(54) ACTIVE NEUTRALIZATION DEVICE

(75) Inventor: Stéphane Bouyat, Saint Cyr (FR)

(73) Assignee: Thales, Neuilly-sur-Seine (FR)

( * ) Notice: Subject to any disclaimer, the term of this patent is extended or adjusted under 35 U.S.C. 154(b) by 0 days.

(21) Appl. No.: 13/334,793

(22) Filed: Dec. 22, 2011

(65) Prior Publication Data

US 2012/0326789 A1    Dec. 27, 2012

(30) Foreign Application Priority Data

Dec. 23, 2010  (FR) ...................................... 10 05079

(51) Int. Cl.
*H03F 1/14*    (2006.01)
(52) U.S. Cl.
CPC ........................................ *H03F 1/14* (2013.01)
USPC .......................................... 330/292; 327/382
(58) Field of Classification Search
USPC .......................................................... 330/292
See application file for complete search history.

(56) References Cited

U.S. PATENT DOCUMENTS 6,768,389 B2 *   7/2004   Dent et al. .................... 331/175

FOREIGN PATENT DOCUMENTS

EP        1426771 A1    2/2006
WO    2007062967 A1    6/2007

OTHER PUBLICATIONS

Tahar J, "Microwave life detector for buried victims using neutrodyning loop based system"; Journal of Applied Geophysics, Elsevier, Amsterdam, NL, vol. 68, No. 3, Jul. 1, 2009.

* cited by examiner

*Primary Examiner* — Robert Pascal
*Assistant Examiner* — Khiem Nguyen
(74) *Attorney, Agent, or Firm* — Michael J. Donohue; Davis Wright Tremaine LLP

(57) ABSTRACT

The present invention relates to a device for neutralization of a signal obtained by transposition to a high frequency of a useful signal supplied by a unit of equipment, the said equipment having a spurious capacitance $C_{parasite}$ that varies over time. The device comprises a neutralization capacitance $C_{neut}$ and means with adjustable gain G, together with means for feedback controlling the gain G in such a manner that, continuously, $G \times C_{neut} = C_{parasite}$.

9 Claims, 5 Drawing Sheets

ACTIVE NEUTRALIZATION DEVICE

Figure 1:
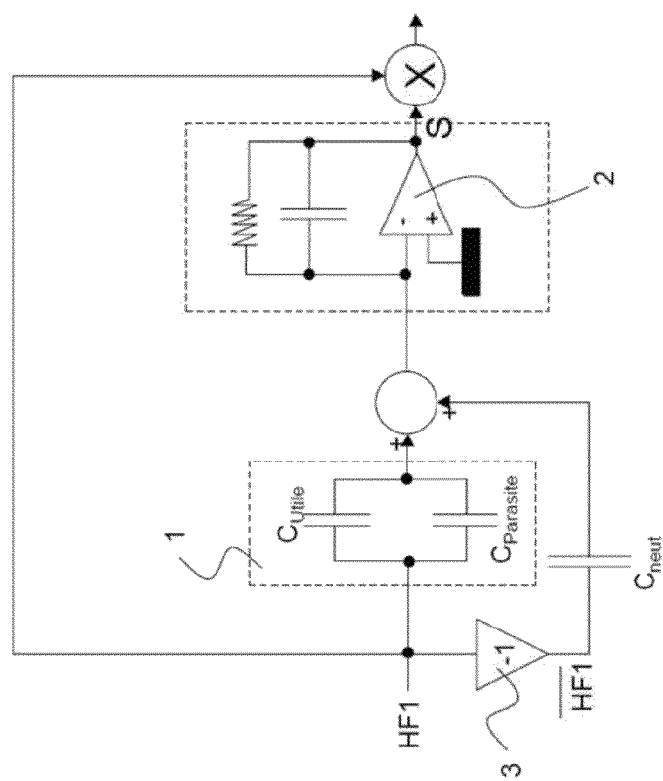

The present invention relates to an active neutralization device. It is for example applicable in the field of processing electronics for information from sensors and from capacitive detectors.

Processing electronics for information from sensors and from capacitive detectors can require the use of a high-frequency (HF) signal as a carrier for the useful information, of the order of 10 to 20 times the frequency of the useful signal. This HF carrier must then be eliminated or reduced in the amplification and demodulation stages of the useful signal to be processed. The neutralization consists in injecting, into these stages, a signal in phase opposition to the HF carrier. The level of the signal in phase opposition allows the HF carrier to be cancelled or reduced and thus the signal-to-noise ratio to be enhanced and the saturation of the amplification and demodulation stages of the useful signal to be avoided.

As explained in the following part of the present application, the current neutralization techniques require an adjustment via potentiometers or similar devices. On the one hand, this adjustment must be carried out on each sensor or detector individually, because the level to be adjusted is often directly linked to spurious capacitances not well controlled in the sensor or the detector. On the other hand, since this adjustment is carried out once and for all during the initial production phases of the sensor or of the detector, any later variation or drift cannot be compensated.

One notable aim of the invention is to implement an active neutralization which continually adapts itself in such a manner as to optimize the residual level of the HF carrier. For this purpose, the subject of the invention is a device for neutralization of a signal obtained by transposition to a high frequency of a useful signal supplied by a unit of equipment, the said equipment having a spurious capacitance $C_{parasite}$ that varies over time. The device comprises a neutralization capacitance $C_{neut}$ and means with adjustable gain G, together with means for feedback controlling the gain G in such a manner that, continuously, $G \times C_{neut} = C_{parasite}$.

For example, the means with adjustable gain G can include a transistor of the JFET type, where the feedback control means are able to voltage control the said transistor so as to adjust its gain. The technique for feedback controlling the gain is known from the prior art and embodiments of this feedback control are present in various devices. For example, television or radio receivers comprise a device for automatic adjustment of the gain (the abbreviation AGC for "automatic gain control" is also used in the prior art to denote this device) allowing it to adapt to the variations in power of the radio waves received by the receiver. Another example is the oscillator of the Wien bridge type in which the gain is adjusted in order to produce a self-oscillation condition.

Advantageously, the feedback control means can include means for transposing the useful signal to the high frequency, means for eliminating the non-DC component of the transposed signal and means for correcting the current value of the gain G using the DC component of the transposed signal.

Advantageously here again, the correction means can include means for estimating, in the DC component of the signal transposed to the high frequency, a component proportional to the difference between the level of high frequency due to the current neutralization value $G \times C_{neut}$ and the level of high frequency due to the current value of the spurious capacitance $C_{parasite}$, the correction means being capable of deducing from this proportional component the correction to be applied to the gain G.

For example, the means for estimating the component proportional to the difference between the level of high frequency due to the current neutralization value $G \times C_{neut}$ and the level of high frequency due to the current value of the spurious capacitance $C_{parasite}$ can include a low-pass filter and/or an integrator.

For example, the means for eliminating the non-DC component of the transposed signal can include a CIC filter.

In one embodiment, the means for feedback control can be implemented within an FPGA.

The unit of equipment can be a MEMS cell, for example a gyrometer.

The invention furthermore has the main advantages that, in a mode of operation under a thermal gradient and with long-term drift effects, it allows the noise performance characteristics to be guaranteed.

Figure 2:
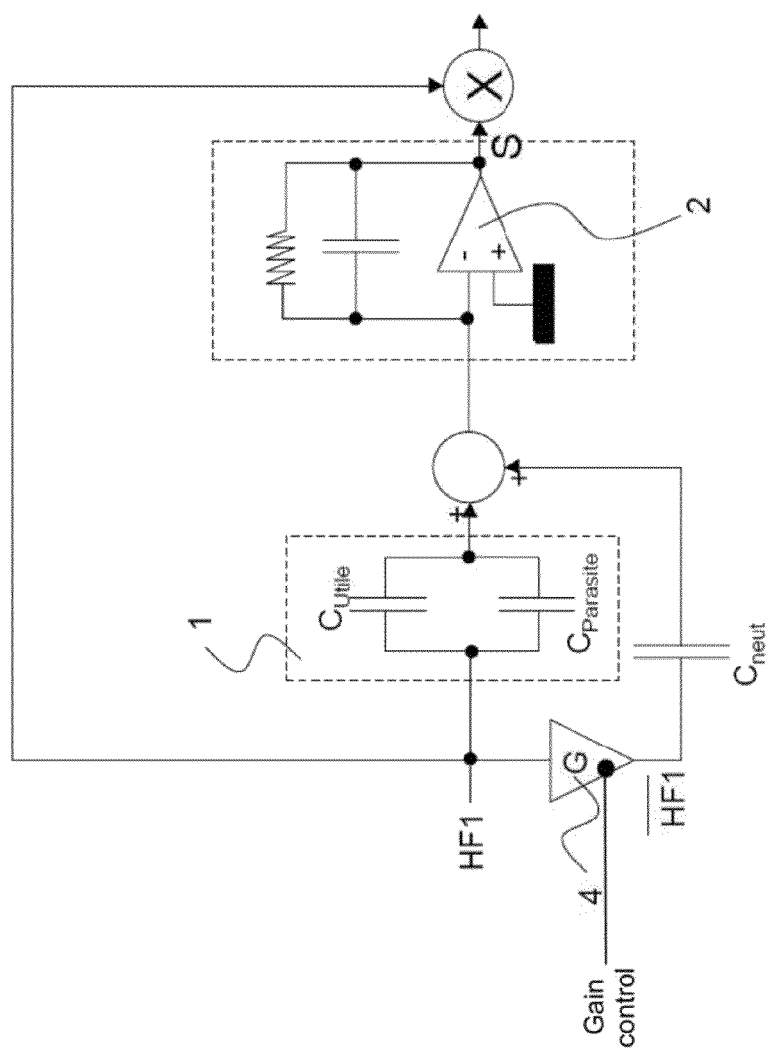
Figure 3:
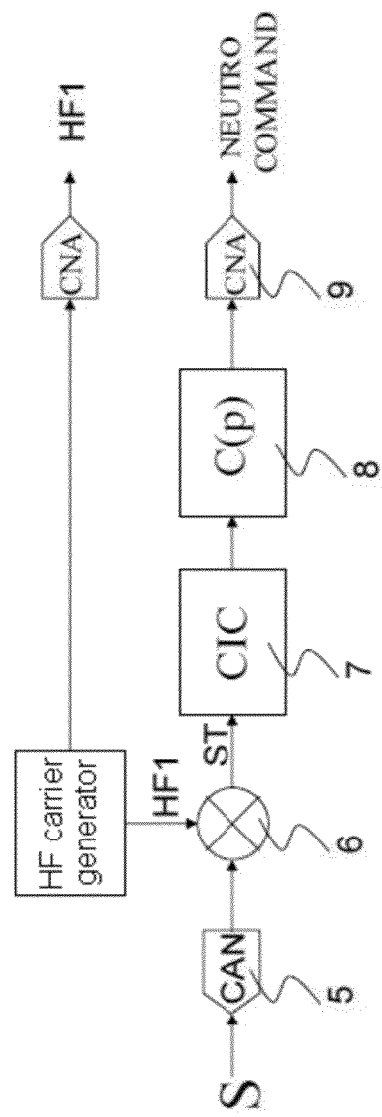
Figure 4:
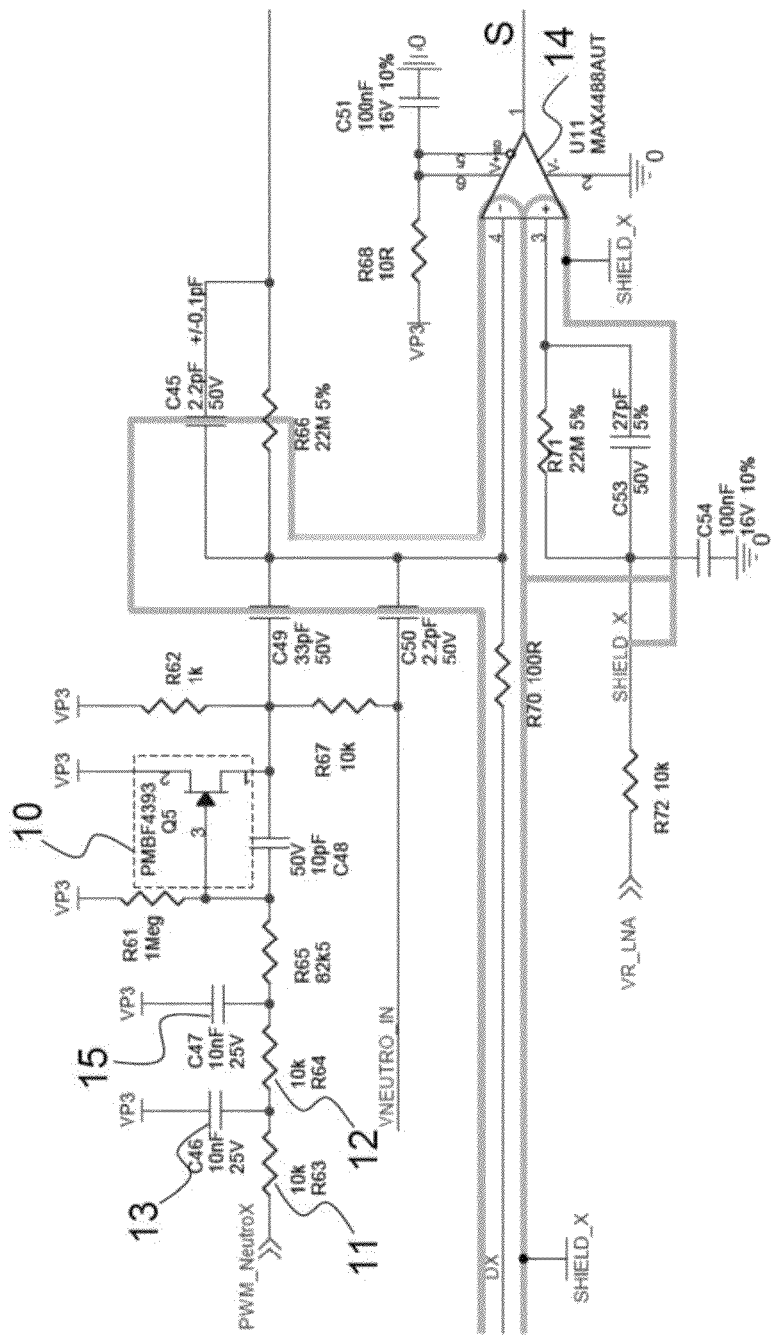
Figure 5:
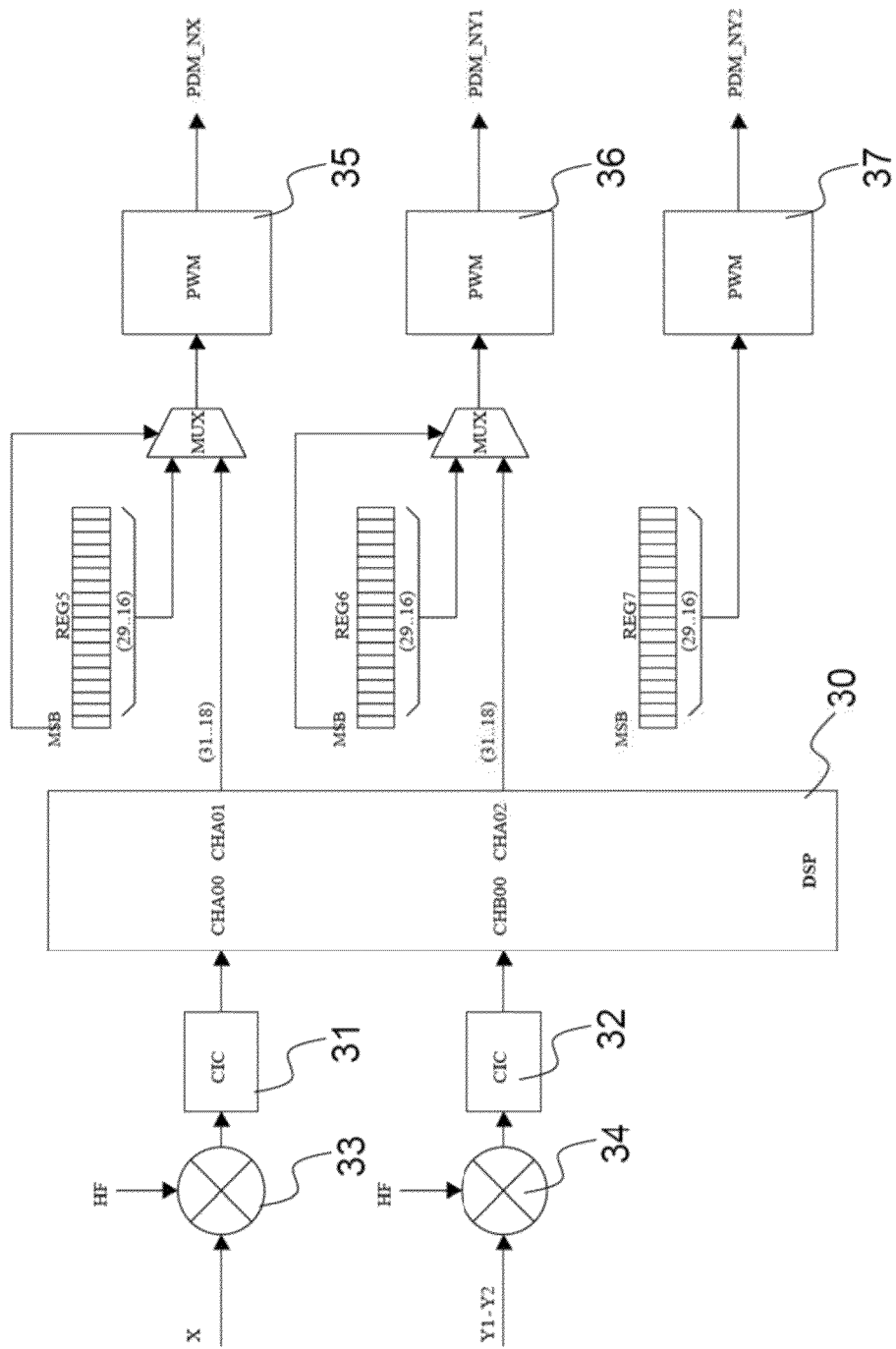

Other features and advantages of the invention will become apparent with the aid of the description that follows presented with regard to the appended drawings which show:

FIG. 1, with a schematic circuit diagram, the principles of the passive neutralization according to the prior art;

FIG. 2, with a schematic circuit diagram, the principles of the active neutralization according to the invention;

FIG. 3, with a schematic circuit diagram, the principles of operation of a control authority according to the invention;

FIGS. 4 and 5, with schematic circuit diagrams, exemplary embodiments according to the invention.

FIG. 1 illustrates, with a schematic circuit diagram, a passive neutralization device according to the prior art in the case of a MEMS (Micro-Electro-Mechanical Systems) cell 1, whether this be a sensor cell or a detector cell, this cell 1 having a useful capacitance $C_{utile}$ and a spurious capacitance $C_{parasite}$. A carrier HF1 is needed as a carrier for the detection signals, the carrier HF1 having a frequency of the order of 10 to 20 times the frequency of these detection signals because the phase precisions sought in the modulation/demodulation operations are in the range between 0.001° and 0.01° depending on the applications targeted. Such precisions are inaccessible if the detection signal is not separated from the excitation signal, because the excitation signal will make the phase of the detection rotate, the two signals being in phase-quadrature. Spectral separation by HF carrier is one of the techniques that enables this type of problem to be treated. It does however need to make use of a neutralization operation by injecting the carrier in phase opposition $\overline{HF1}$ into the load amplifier 2. This neutralization operation is above all necessary in order that the load amplifier 2 does not saturate. Indeed, the HF carrier is chosen with a sufficiently high amplitude to guarantee a sufficient detection level and not to adversely affect the signal-to-noise ratio. The neutralization operation above all prevents the saturation of the load amplifier 2, but it has other impacts on the performance characteristics of the cell 1. Indeed, if $\eta_{HF}$ denotes the noise from the HF generator, which generates the carrier HF1, the latter generates two to three times this noise at the output of the load amplifier 2. This significantly degrades the noise performance. The principle of the neutralization is to inject a signal in phase opposition $\overline{HF1}$, hence with a correlated noise $-\eta HF$ that will compensate the noise due to the HF generator, which will be in ratios depending on the quality of neutralization and on the symmetry between the carrier HF1 and the signal in phase opposition $\overline{HF1}$. The obvious advantage may be noted here of generating the carrier HF1 and the signal in phase opposition $\overline{HF1}$ with a differential output amplifier or any device providing real phase opposition and hence good noise correlation.

As previously made clear, the neutralization was, until now, provided by a capacitive or resistive adjustment carried out at the factory, by simply using a component 3 with fixed gain equal to −1 and a neutralization capacitance $C_{neut}$ such that $C_{neut}=C_{parasite}$. Aside from the fact that these adjustment operations are difficult or costly to industrialize, they also have the drawback of not adapting the neutralization during the operation of the equipment. Consequently, in a mode of operation under a thermal gradient and with long-term drift effects, the noise performance characteristics cannot be maintained.

FIGS. 2 and 3 illustrate with schematic circuit diagrams basic principles of the invention. In FIG. 2, the component 3 with fixed gain equal to −1 is replaced by a component 4 with adjustable gain G. In one preferred embodiment, it can be chosen that $C_{neut} \geq C_{parasite}$ and to vary G between −1 and 0 in such a manner as to preserve the equality $C_{neut} \times G = C_{parasite}$. It should be clearly understood that the component 4 with adjustable gain G can be implemented in various ways. For example, it could be a JFET (Junction Field Effect Transistor) used as a potentiometer, as in the exemplary embodiment that follows. But any other component whose gain can be feedback controlled can be used.

The signal S at the output of the load amp 2 may be written according to the following equation (1):

$$S = A_{HF} \cdot \sin(\omega_{HF} \cdot t) \times [(A_{cp} + A_{cu} \cdot \sin(\omega_{cu} \cdot t) - A_{neut}] \quad (1)$$

where:
  $A_{HF}$: amplitude of the carrier HF1;
  $\omega_{HF}$: pulse frequency of the carrier HF1;
  $A_{cs}$: HF level due to the presence of $C_{parasite}$;
  $A_{cu}$: modulation level of the useful signal due to the variation of $C_{useful}$;
  $\omega_{cu}$: pulse frequency of the useful signal;
  $A_{neut}$: level of neutralization, which is a control element of the feedback control.

The neutralization is optimum when $A_{neut}=A_{cp}$: spectrally speaking, only the side bands subsist, the HF carrier having disappeared. If (1) is developed, the following is obtained:

$$S=[(A_{cp}-A_{neut}) \cdot A_{HF} \cdot \sin(\omega_{HF} \cdot t)] + A_{HF} \cdot A_{cu}/2 \times [\cos((\omega_{HF}-\omega_{cu}) \cdot t) - \cos((\omega_{HF}+\omega_{cu}) \cdot t)]$$

which may be re-written in the form:

$$S=[(A_{cp}-A_{neut}) \cdot A_{HF} \cdot \sin(\omega_{HF} \cdot t) + A_{cu} \cdot \cos((\omega_{HF}-\omega_{cu}) \cdot t) - A_{cu} \cdot \cos((\omega_{HF}+\omega_{cu}) \cdot t)]$$

For the feedback control of the component 4 with adjustable gain G, it is better to observe the signal S after transposition as illustrated in FIG. 3. FIG. 3 illustrates with a schematic circuit diagram a control authority according to the invention of the component 4 with adjustable gain G via a command NEUTRO_COMMAND, so as to cover the worst cases of variations and of dispersions of the capacitances of the MEMS cell 1. First of all, the analogue signal S can be converted into a digital signal by an analogue-digital converter 5. Then, a frequency transposition is carried out by multiplying, by means of a multiplier 6, the signal S by the carrier HF1, in such a manner as to bring down to around 0 Hertz the side bands containing the useful signal. If ST is the signal after transposition:

$$ST = S \times \sin(\omega_{HF} \cdot t)$$

$$ST=[(A_{cp}-A_{neut}) \cdot A_{HF}/2] - [(A_{cp}-A_{neut}) \cdot A_{HF}/2] \cdot \cos(2 \cdot \omega_{HF} \cdot t) + A_{cu}/2 \cdot \sin((2 \cdot \omega_{HF}-\omega_{cu}) \cdot t) - A_{cu}/2 \cdot \sin((2 \cdot \omega_{HF}+\omega_{cu}) \cdot t) + A_{cu} \cdot \sin(\omega_{cu} \cdot t) \quad (2)$$

In (2) hereinabove, the presence of terms in $2 \cdot \omega_{HF} \cdot t$ can be observed whose DC component is zero. They are of no interest from a signal processing point of view and may be eliminated by filtering. For example, a filter 7 of the "Cascaded Integrator Comb" (CIC) type can be used as a decimator filter, because it allows these terms to be effectively eliminated.

In (2) hereinabove, the presence of the term $A_{cu} \cdot \sin(\omega_{cu} \cdot t)$ is also observed: it is the useful signal to be processed by the I/Q processing of the feedback control loops of the MEMS cell.

But a DC term can also be seen to appear in $[(A_{cp}-A_{neut}) \cdot A_{HF}/2]$: this term is particularly interesting because it provides an image of the neutralization residue. Indeed, it is directly proportional to $(A_{cp}-A_{neut})$ that it is desired to cancel: this term is present before and after the filter 7, because the CIC filters conserve the DC component. Other types of filters may be used in place of the CIC filter 7, as long as they conserve the DC component. The idea of the invention is to use the DC component of the information, after changing the frequency and filtering, for feedback controlling the neutralization values by means of a closed-loop corrector 8. The control signal is initially converted into an analogue signal by a digital-analogue converter 9 in order to supply the command NEUTRO_COMMAND allowing the component 4 with adjustable gain G to be controlled.

With regard to the feedback control corrector 8, this can take the form of a low-pass filter, for example with a time constant of 0.05 second, followed by a simple integrator, for example with a time constant of 2 seconds. The choice of an integrator with a time constant that is long compared with the low-pass filter avoids seeing the pole which would de-stabilize the loop. Depending on the type of corrector chosen, the presence of the low-pass filter is optional, an integrator being able to serve as low-pass filtering.

FIG. 4 illustrates with a schematic circuit diagram one exemplary embodiment of the active neutralization according to the present invention in a MEMS gyrometer using a transistor 10 of the JFET type. In the present exemplary embodiment, this is an N-channel JFET model PMBF4393 distributed by Philips. The useful signal is at 11 kHz and the carrier at 200 kHz. The present invention provides a voltage control authority for the JFET 10 in such a manner as to cover the worst cases of variations and dispersions of the capacitances of the MEMS cells. In the present exemplary embodiment, a control voltage is applied to the grid 3 of the JFET 10 by filtering of a signal PWM_NeutroX modulated in bandwidth (Pulse Width Modulation). The signal PWM_NeutroX comes from a digital processing platform not shown in FIG. 4. The filtering of the signal PWM_NeutroX is achieved by resistors 11, 12 and capacitors 13 and 15.

FIG. 5 illustrates with a schematic circuit diagram one exemplary embodiment of a processing platform according to the present invention, implemented within an FPGA (Field Programmable Gate Array). The platform receives signals X and Y1-Y2 at its inputs. Indeed, in the present exemplary embodiment several signals from the MEMS cell are processed. It notably comprises multipliers 33 and 34, CIC filters 31 and 32, together with a DSP 30 (Digital Signal Processor).

A command PDM_NX (Pulse Density Modulation) corresponds either to a manual command via a register REG5, or to an automatic command via the channel no. 1 from the channel A of the DSP (CHA01). This is the X channel control of the JFET 10 corresponding to the PWM_NeutroX in FIG. 4. A command PDM_NY1 corresponds either to a manual command via a register REG6, or to an automatic command via the channel no. 2 from the channel A of the DSP (CHA02). This is the Y1 channel neutralization control. A command PDM_NY2 corresponds to a manual command via a register REG7 only. This is the Y2 channel neutralization control. The feedback control will find its point of equilibrium, but a factory pre-adjustment on the Y2 channel is recommended.

It should be clearly understood that, even if the present embodiment has been implemented within an FPGA, other embodiments of the invention are possible.

The invention claimed is:

1. Device for neutralization of a signal obtained by transposition to a high frequency of a useful signal supplied by a unit of equipment (1), the said equipment (1) having a spurious capacitance $C_{parasite}$ that varies over time, the device being characterized in that it comprises a neutralization capacitance $C_{neut}$ and means (4) with adjustable gain G, the device comprising means for feedback controlling the gain G in such a manner that, continuously, $G \times C_{neut} = C_{parasite}$.

2. Device according to claim 1, characterized in that the means with adjustable gain G include a transistor of the JFET type (10), the feedback control means voltage controlling the said transistor so as to adjust its gain.

3. Device according to claim 1, characterized in that the means for feedback controlling include:
   means for transposing the useful signal to the high frequency;
   means for eliminating the non-DC component of the transposed signal;
   means (8) for correcting the current value of the gain G using the DC component of the transposed signal.

4. Device according to claim 3, characterized in that the correction means (8) include means for estimating, within the DC component of the signal transposed to the high frequency, a component proportional to the difference between the level of high frequency due to the current neutralization value $G \times C_{neut}$ and the level of high frequency due to the current value of the spurious capacitance $C_{parasite}$, the correction means deducing, from this proportional component, the correction to be applied to the gain G.

5. Device according to claim 4, characterized in that the means for estimating the component proportional to the difference between the level of high frequency due to the current neutralization value $G \times C_{neut}$ and the level of high frequency due to the current value of the spurious capacitance $C_{parasite}$ include a low-pass filter and/or an integrator.

6. Device according to claim 3, characterized in that the means for eliminating the non-DC component of the transposed signal include a CIC filter, or "Cascaded Integrator Comb" filter, (7).

7. Device according to claim 1, characterized in that the feedback control means are implemented within an FPGA, or "Field Programmable Gate Array".

8. Device according to claim 1, characterized in that the equipment (1) is a MEMS cell, for Micro-Electra-Mechanical Systems.

9. Device according to claim 8, characterized in that the MEMS cell, for Micro-Electro-Mechanical Systems, is a gyrometer.

* * * * *